US009842914B1

(12) United States Patent
Yeung et al.

(10) Patent No.: US 9,842,914 B1
(45) Date of Patent: Dec. 12, 2017

(54) NANOSHEET FET WITH WRAP-AROUND INNER SPACER

(71) Applicant: International Business Machines Corporation, Armonk, NY (US)

(72) Inventors: Chun W. Yeung, Niskayuna, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/241,772

(22) Filed: Aug. 19, 2016

(51) Int. Cl.
*H01L 21/02* (2006.01)
*H01L 29/66* (2006.01)
*H01L 29/06* (2006.01)

(52) U.S. Cl.
CPC .... *H01L 29/6681* (2013.01); *H01L 21/02532* (2013.01); *H01L 21/02587* (2013.01); *H01L 29/0665* (2013.01); *H01L 29/66553* (2013.01)

(58) Field of Classification Search
CPC . H01L 21/8258; H01L 21/8238; H01L 21/02; H01L 21/306; H01L 21/00
USPC ............................ 438/212, 50, 158, 285, 287
See application file for complete search history.

(56) References Cited

U.S. PATENT DOCUMENTS

| | | | |
|---|---|---|---|
| 7,476,578 B1 | 1/2009 | Cheng et al. | |
| 8,174,055 B2 | 5/2012 | Bonser et al. | |
| 8,716,797 B2 | 5/2014 | Basker et al. | |
| 9,224,849 B2 | 12/2015 | Colinge et al. | |
| 9,276,064 B1 | 3/2016 | Zang et al. | |
| 2013/0270512 A1* | 10/2013 | Radosavljevic | ........................... H01L 21/823821 257/9 |
| 2014/0001441 A1 | 1/2014 | Kim et al. | |
| 2015/0014788 A1 | 1/2015 | Park | |
| 2015/0069328 A1 | 3/2015 | Leobandung | |
| 2015/0333167 A1 | 11/2015 | Leobandung | |

OTHER PUBLICATIONS

Bergendahl, et al., "Forming Stacked Nanowire Semiconductor Device," U.S. Appl. No. 15/008,615, filed Jan. 28, 2016, 40 pages.

* cited by examiner

*Primary Examiner* — Julio J Maldonado
*Assistant Examiner* — Rodolfo D. Fortich
(74) *Attorney, Agent, or Firm* — Cantor Colburn LLP; Vazken Alexanian

(57) ABSTRACT

A method of forming a semiconductor device and resulting structures having stacked nanosheets with a wrap-around inner spacer by forming a nanosheet stack disposed above a substrate; forming a top sacrificial layer on a top surface of the nanosheet stack; forming a sidewall sacrificial layer on two opposite sidewalls of the nanosheet stack, such that a first and a second end of a first vertically-stacked nanosheet are exposed; removing the sidewall sacrificial layer, a portion of a first and a second end of a first sacrificial layer, and a portion of a first and a second end of a top sacrificial layer to expose portions of the first vertically-stacked nanosheet; and forming an inner spacer region on the first vertically-stacked nanosheet to replace the removed sidewall sacrificial layer, the removed portions of the first sacrificial layer, and the removed portions of the top sacrificial layer.

20 Claims, 18 Drawing Sheets

NANOSHEET FET WITH WRAP-AROUND INNER SPACER

BACKGROUND

The present invention relates in general to semiconductor device fabrication methods and resulting structures. More specifically, the present invention relates to fabrication methods and resulting structures for a semiconductor device having stacked nanosheets with a wrap-around inner spacer.

In contemporary semiconductor device fabrication processes a large number of semiconductor devices, such as field effect transistors (FETs), are fabricated on a single wafer. FETs employ semiconductor fins to introduce on-wafer topography. With growing challenges in maintaining physical gate-length scaling and device performance tradeoff, extending the technology roadmap with lateral devices to and beyond the 10 nm technology node is becoming increasingly difficult. Non-planar device architectures, such as vertical fin and nanosheet FET devices, result in increased device density over lateral devices.

SUMMARY

According to an embodiment of the present invention, a method of fabricating a semiconductor device having stacked nanosheets with a wrap-around inner spacer is provided. The method can include forming a nanosheet stack disposed above a substrate, the nanosheet stack having a first vertically-stacked nanosheet on a first sacrificial layer, the first vertically-stacked nanosheet and the first sacrificial layer each having a first end facing a first epitaxy region and a second end facing a second epitaxy region; forming a top sacrificial layer on a top surface of the nanosheet stack, said top sacrificial layer having a first end facing a first epitaxy region and a second end facing a second epitaxy region; forming a sidewall sacrificial layer on two opposite sidewalls of the nanosheet stack, such that the first and second ends of the first vertically-stacked nanosheet are exposed; removing the sidewall sacrificial layer, a portion of the first and second ends of the first sacrificial layer, and a portion of the first and second ends of the top sacrificial layer to expose portions of the first vertically-stacked nanosheet; and forming an inner spacer region on the first vertically-stacked nanosheet to replace the removed sidewall sacrificial layer, the removed portions of the first sacrificial layer, and the removed portions of the top sacrificial layer.

According to another embodiment of the present invention, a method of fabricating a semiconductor device having stacked nanosheets with a wrap-around inner spacer is provided. The method can include forming a nanosheet stack disposed above a substrate, the nanosheet stack having a plurality of vertically-stacked nanosheets alternating with a plurality of sacrificial layers, such that each nanosheet is separated by a sacrificial layer and such that the substrate is separated from the nanosheet stack by a sacrificial layer, each nanosheet and sacrificial layer having a first end facing a first epitaxy region and a second end facing a second epitaxy region; forming a sacrificial material cover over a top surface and two opposite sidewalls of the nanosheet stack, said sacrificial material cover exposing the first and second ends of the first vertically-stacked nanosheet; forming a gate structure on the nanosheet stack, said gate structure including a sacrificial gate having two gate sidewalls and an outer spacer formed on each of the two gate sidewalls; removing a portion of the sacrificial material cover and a portion of the first sacrificial layer from the first and second ends of the first sacrificial layer to expose portions of the first vertically-stacked nanosheet; and forming an inner spacer region on the first vertically-stacked nanosheet to replace the removed sacrificial material cover and the removed portions of the first sacrificial layer.

According to another embodiment of the present invention, a structure having stacked nanosheets with a wrap-around inner spacer is provided. The structure can include a nanosheet stack disposed above a substrate, the nanosheet stack having a first nanosheet on a first sacrificial layer, the first nanosheet and the first sacrificial layer each having a first end facing a first epitaxy region and a second end facing a second epitaxy region, said first and second ends of the first sacrificial layer recessed from the first and second ends of the first nanosheet; a top sacrificial layer on a top surface of the nanosheet stack, the top sacrificial layer having a first end facing a first epitaxy region and a second end facing a second epitaxy region, said first and second ends of the top sacrificial layer recessed from the first and second ends of the first nanosheet; and an inner spacer region wrapping around a top surface, a bottom surface, and two sidewall surfaces of the first nanosheet, such that the first and second ends of the first nanosheet are exposed.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

DETAILED DESCRIPTION

Figure 1:
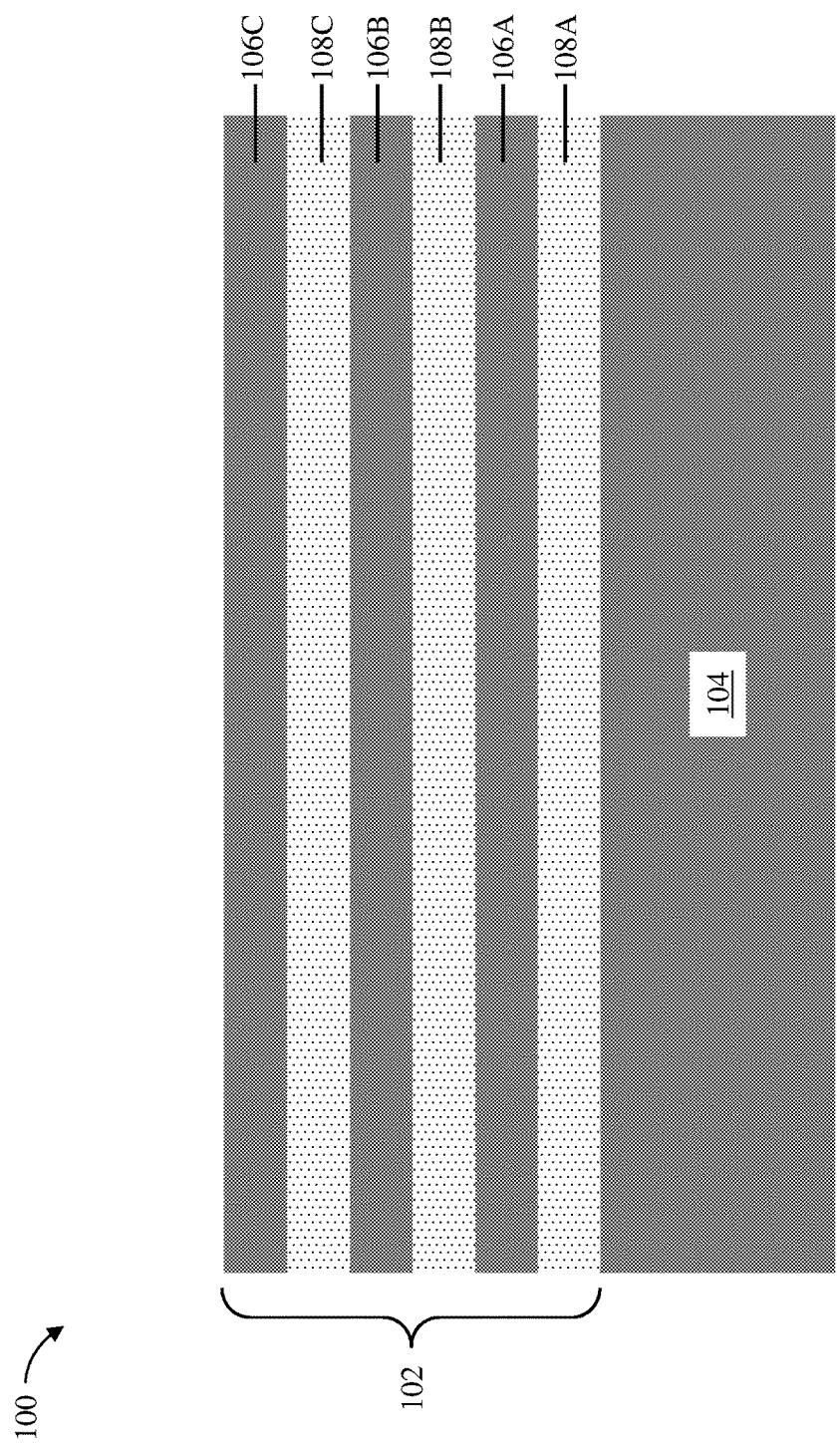
FIG. 1 depicts a cross-sectional view of a structure having a nanosheet stack formed on a substrate during an intermediate operation of a method of fabricating a semiconductor device according to one or more embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device having an etch-resistant interlayer dielectric that maintains height during a top epitaxy clean according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, and atomic layer deposition (ALD) among others.

Removal/etching is any process that removes material from the wafer. Examples include etch processes (either wet or dry), and chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of technologies relevant to the present invention, as previously noted herein, non-planar device architectures, such as vertical fin and nanosheet FET devices, result in increased device density over lateral devices. However, there are challenges in providing non-planar FETs having equal or superior performance characteristics to lateral devices. For example, some non-planar devices require careful management of transistor drive currents while reducing short-channel effects, parasitic capacitance and off-state leakage. Nanosheet-based FET devices provide a non-planar device topology that advantageously enables improved control of short channel effects. For example, in nanosheet-based transistors the gate stack wraps around the full perimeter of the nanosheet, enabling fuller depletion in the channel region, and reducing short-channel effects due to steeper sub-threshold current swing (SS) and smaller drain induced barrier lowering (DIBL). Wrap-around gate structures and source/drain contacts used in nanosheet devices also enable greater management of leakage and capacitance in the active regions, even as drive currents increase.

The fabrication of nanosheet FET semiconductor structures requires forming an inner spacer between adjacent nanosheets. The inner spacer can be any insulating material, such as, for example, a low-k dielectric material. The inner spacer acts to reduce the parasitic overlap capacitance between the gate and the source/drain epitaxy regions. Parasitic capacitance, or conductor-to-conductor capacitance, between two conductors is a function of the length and thickness of the conductors as well as the distance separating the conductors. Parasitic capacitance contributes to undesired device effects such as resistive-capacitive (RC) delay, power dissipation, and cross-talk. RC delay refers to the delay in signal speed or propagation experienced in a circuit as a function of the product of the resistance and capacitance of the circuit components. Unfortunately, parasitic capacitance continues to increase as device dimensions and component spacing shrinks to meet increasing demands for smaller electronic devices.

While the use of inner spacers serves to reduce the parasitic overlap capacitance between the gate and the source/drain epitaxy regions, the use of inner spacers introduces gate length fabrication difficulties. The gate lengths on the top and bottom surfaces of a nanosheet are determined by the respective dimensions of the top and bottom inner spacers. If inner spacers are not present on the two sidewalls of a nanosheet, the gate lengths on the two sidewalls are determined by the conventional outer spacer which is formed prior to the inner spacers. It is therefore difficult to ensure a uniform gate length for all nanosheet surfaces. Thus, a method is desired for forming an inner spacer structure wrapping around the top, bottom, and sidewall surfaces of each nanosheet, the inner spacer structure simultaneously formed to provide improved gate length control.

One or more embodiments of the present invention provide methods of fabricating a semiconductor device having a simultaneously formed inner spacer structure wrapping around the top, bottom, and sidewall surfaces of each nanosheet. The described methods employ a lateral wet or dry etch to selectively remove a portion of a sacrificial layer, forming a region which can be simultaneously filled with by the inner spacer material. Methods for fabricating a semiconductor device having a simultaneously formed wrap-around inner spacer structure and the resulting structures therefrom in accordance with embodiments of the present invention are described in detail below by referring to the accompanying drawings in FIGS. 1-18.

FIG. 1 illustrates a cross-sectional view of a structure 100 having a nanosheet stack 102 formed on a substrate 104 during an intermediate operation of a method of fabricating a semiconductor device according to one or more embodiments. In some embodiments, the nanosheet stack 102 includes three vertically-stacked nanosheets 106A, 106B, and 106C alternating with three sacrificial layers 108A, 108B, and 108C. For ease of discussion reference is made to operations performed on and to a nanosheet stack having three nanosheets (106A, 106B, and 106C). It is understood, however, that the nanosheet stack 102 can include any number of nanosheets alternating with a corresponding number of sacrificial layers.

In some embodiments, the nanosheet stack 102 includes a single nanosheet separated from the substrate 104 by a single sacrificial layer. In still other embodiments, the nanosheet stack 102 includes two nanosheets alternating with two sacrificial layers. The nanosheets can be any suitable material such as, for example, monocrystalline silicon. The substrate 104 can be any suitable substrate material, such as, for example, monocrystalline Si, SiC, or semiconductor-on-insulator (SOI). In some embodiments, the sacrificial layers can be silicon germanium (SiGe). In still other embodiments, the sacrificial layers can be silicon germanium (SiGe) layers having a thickness of about 4 nm to about 10 nm. In yet other embodiments, the sacrificial layers can be silicon germanium (SiGe) layers having a thickness of about 6 nm.

Figure 2:
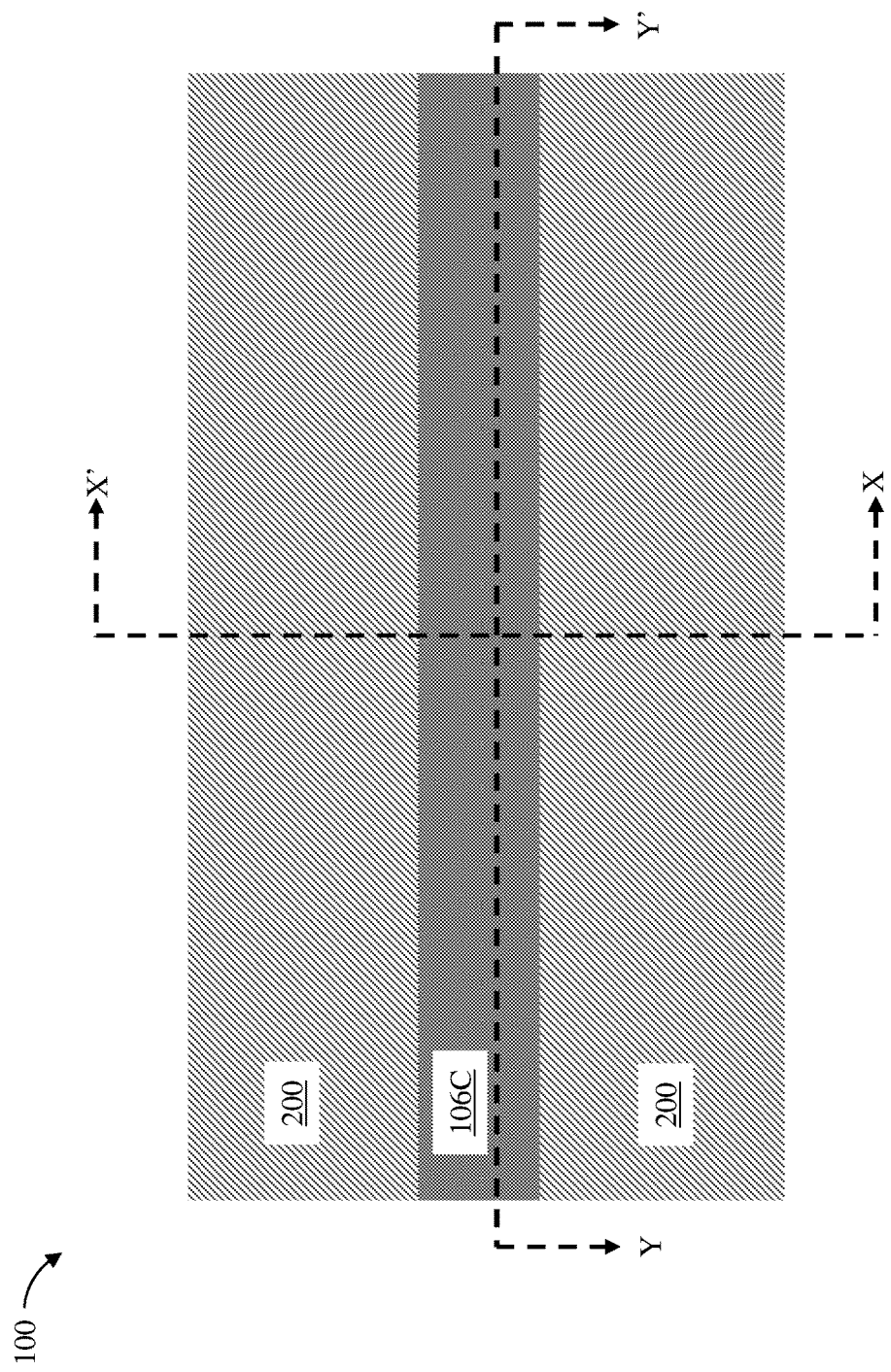
FIG. 2 depicts a top-down view of the structure after removing portions of the nanosheet stack to expose a first portion and a second portion of the substrate according to one or more embodiments of the present invention.

FIG. 2 illustrates a top-down view of the structure 100 after removing portions of the nanosheet stack 102 to expose a first portion and a second portion of the substrate 104 during an intermediate operation of a method of fabricating a semiconductor device according to one or more embodiments. Any known manner of removing portions of the nanosheet stack 102 can be utilized. In some embodiments, a lithography operation including a patterned hard mask can be used to remove portions of the nanosheet stack 102. The first portion and the second portion of the substrate 104 are on opposite sides of the nanosheet stack 102. A dielectric isolation layer 200 is formed on the exposed portions of the substrate 104. The dielectric isolation layer 200 serves as a shallow trench isolation (STI) region that prevents electrical current leak between adjacent semiconductor device components. Any known composition and manner of forming the dielectric isolation layer 200 can be utilized. In some embodiments, the substrate 104 is first etched to form a trench, and thereafter an oxide layer, such as silicon oxide, is deposited to fill up the trench. The oxide layer can be etched via an etch back after a chemical-mechanical planarization (CMP) process.

Figure 3:
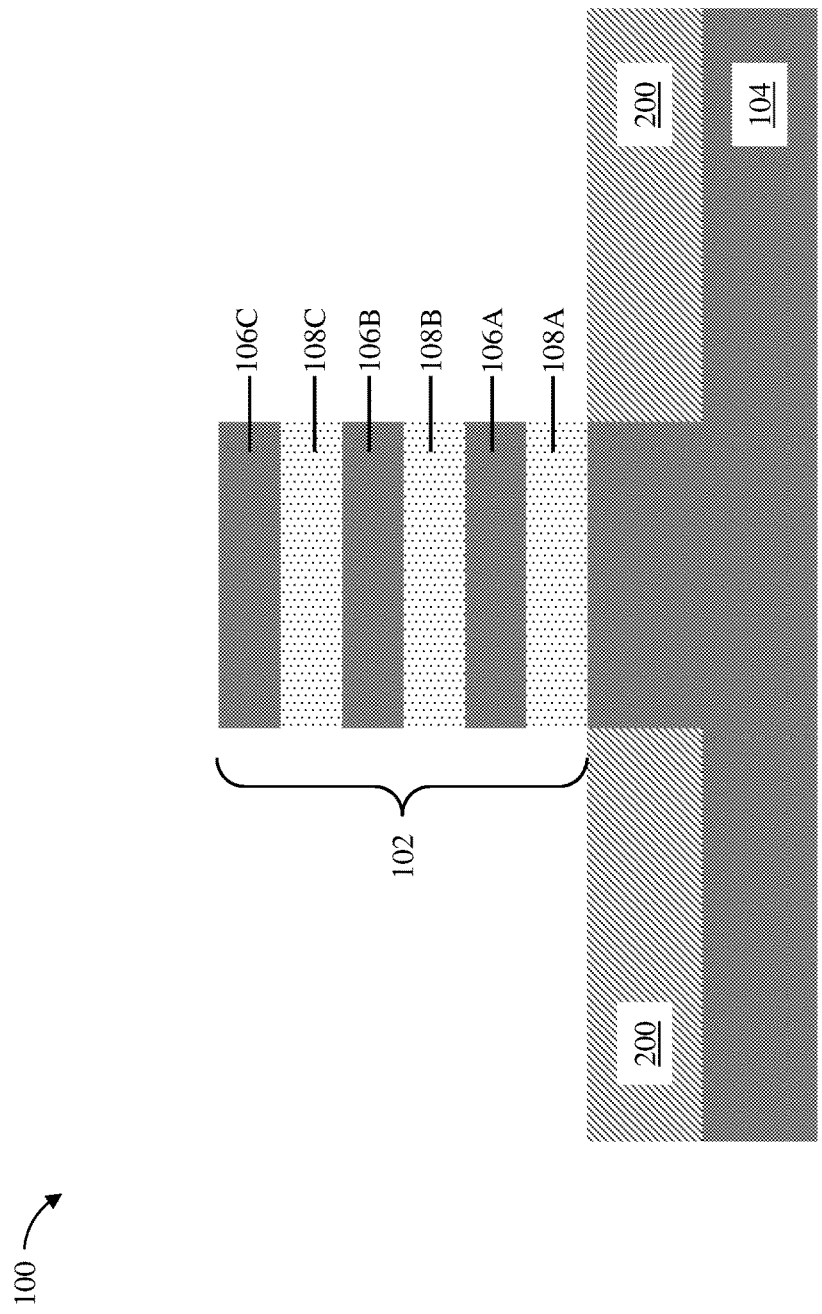
FIG. 3 depicts a cross-sectional view of the structure along the line X-X' of FIG. 2 after an intermediate operation of a method of fabricating a semiconductor device according to one or more embodiments of the present invention.

FIG. 3 illustrates a cross-sectional view of the structure 100 along the line X-X' of FIG. 2 formed during an intermediate operation of a method of fabricating a semiconductor device according to one or more embodiments. The dielectric isolation layer 200 is formed on the exposed portions of the substrate 104.

Figure 4:
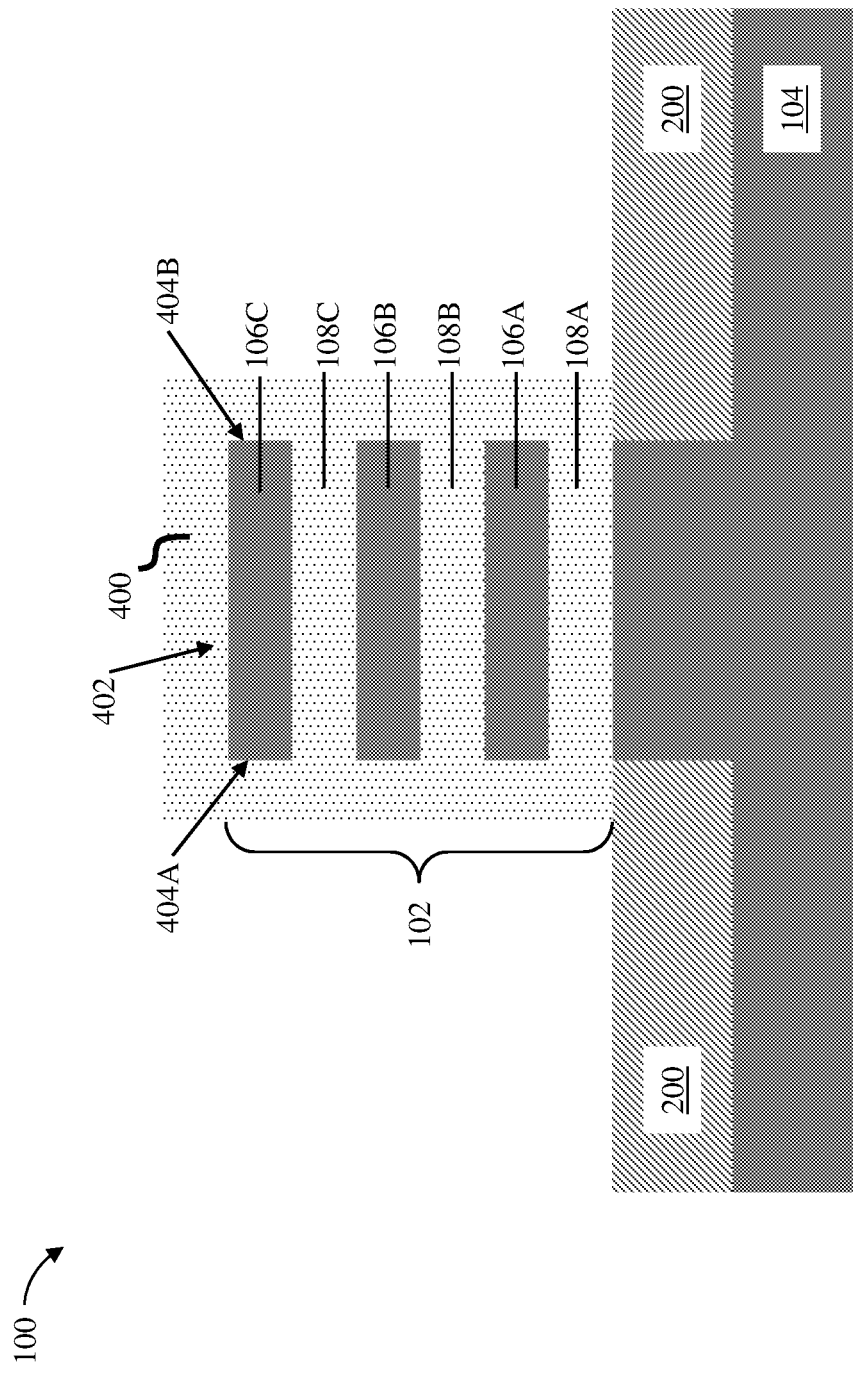
FIG. 4 depicts a cross-sectional view of the structure along the line X-X' of FIG. 2 after an intermediate operation of a method of fabricating a semiconductor device according to one or more embodiments of the present invention.

FIG. 4 illustrates a cross-sectional view of the structure 100 along the line X-X' of FIG. 2 formed during an intermediate operation of a method of fabricating a semiconductor device according to one or more embodiments. In one embodiment, a sacrificial material cover 400 is formed over a top surface 402 of the nanosheet 106C (i.e., the top surface of the nanosheet in the nanosheet stack furthest from the substrate) and two opposite sidewalls 404A and 404B of the nanosheet stack 102. In this manner, the sacrificial material cover 400 wraps around the nanosheet stack 102, later, exposing a first and second end (illustrated in FIG. 18) of each nanosheet 106A, 106B, and 106C. In still other embodiments, the sacrificial material cover 400 is formed over a top surface of a vertically-stacked nanosheet furthest from the substrate 104. In some embodiments, the sacrificial material cover 400 can be silicon germanium (SiGe) and is the same material as 108A, 108B and 108C. Any known composition and manner of forming the sacrificial material cover 400 can be utilized. In some embodiments, the sacrificial material cover 400 is conformally formed to ensure a uniform thickness using epitaxial approaches such as chemical vapor deposition (CVD).

Figure 5:
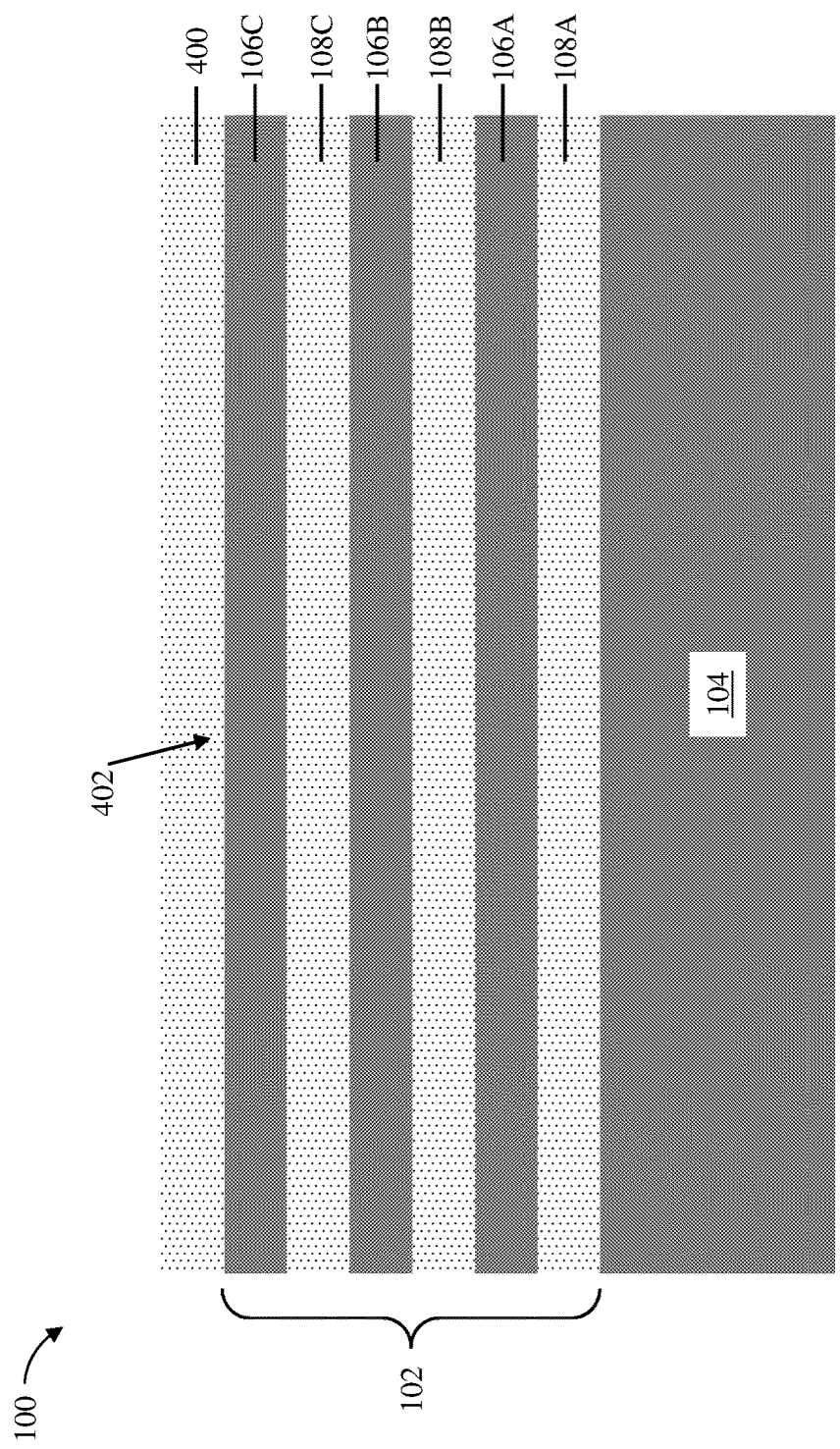
FIG. 5 depicts a cross-sectional view of the structure along the line Y-Y' of FIG. 2 after forming the sacrificial material cover over the top surface of the nanosheet according to one or more embodiments of the present invention.

FIG. 5 illustrates a cross-sectional view of the structure 100 along the line Y-Y' of FIG. 2 after forming the sacrificial material cover 400 over the top surface 402 of the nanosheet 106C.

Figure 6:
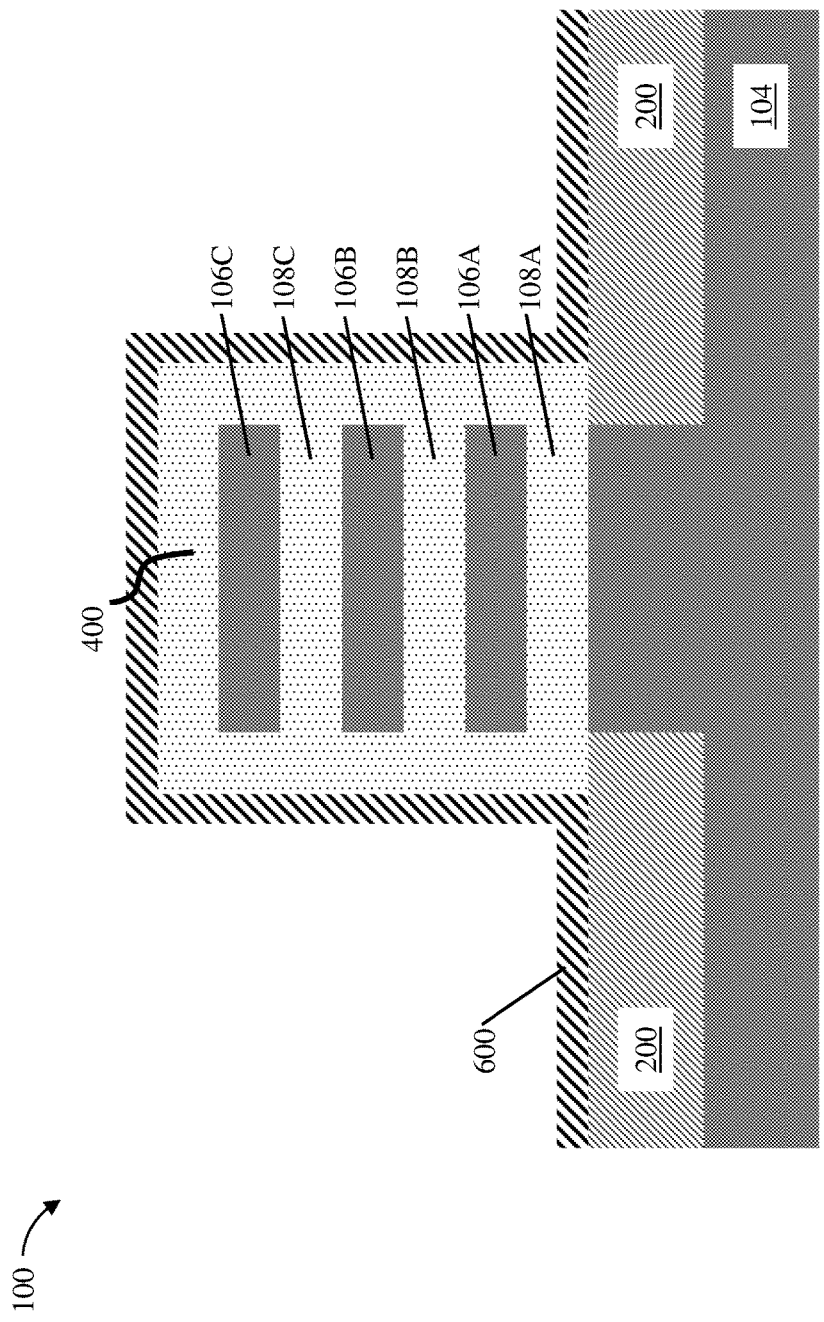
FIG. 6 depicts a cross-sectional view of the structure along the line X-X' of FIG. 2 after forming a sacrificial liner on the sacrificial material cover and the dielectric isolation layer according to one or more embodiments of the present invention.

FIG. 6 illustrates a cross-sectional view of the structure 100 along the line X-X' of FIG. 2 after forming a sacrificial liner 600 on the sacrificial material cover 400 and the dielectric isolation layer 200. The sacrificial liner 600 can be any suitable material, such as, for example, a silicon oxide. In some embodiments, the sacrificial liner 600 is silicon dioxide ($SiO_2$).

Figure 7:
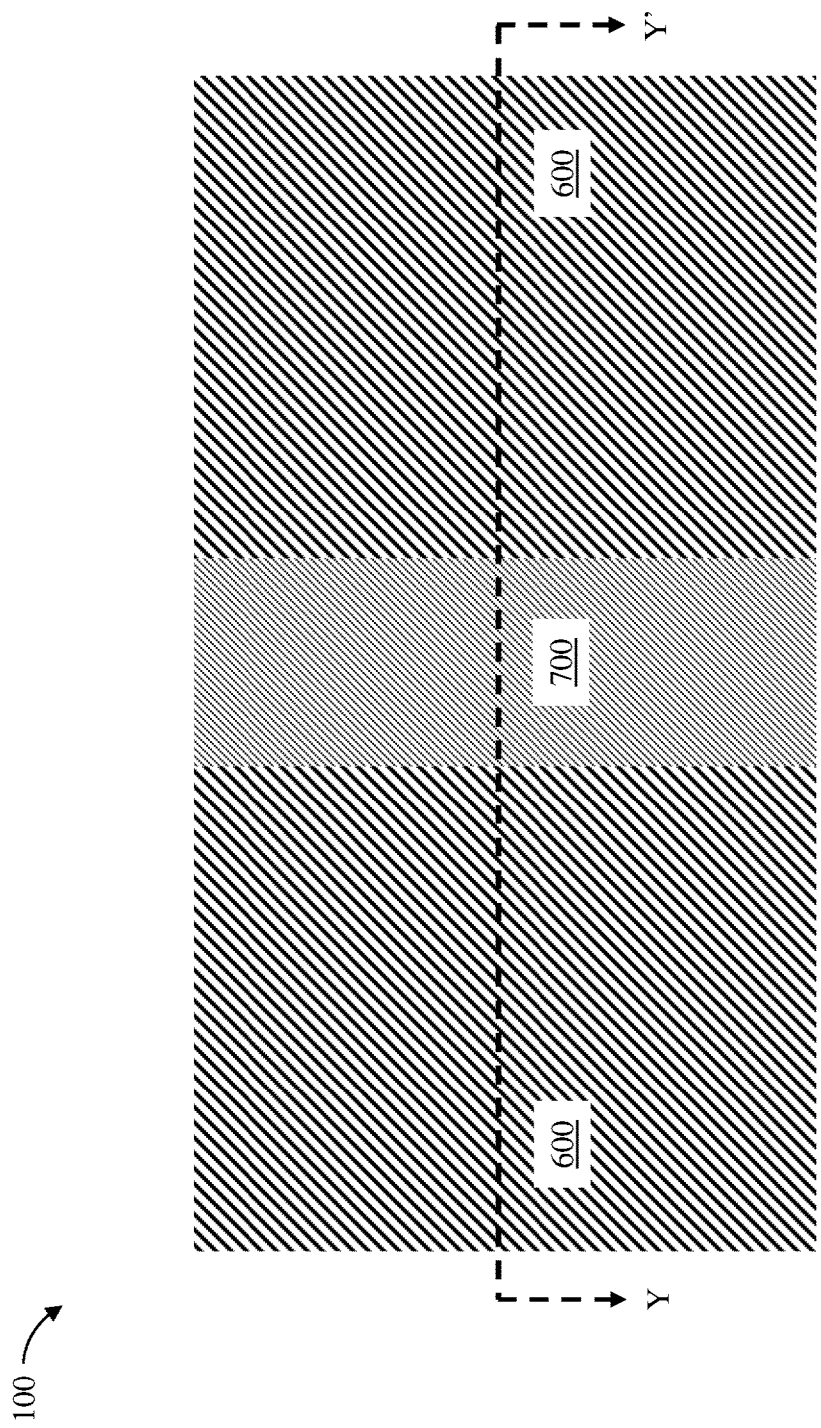
FIG. 7 depicts a top-down view of the structure after an intermediate operation of a method of fabricating a semiconductor device according to one or more embodiments of the present invention.

FIG. 7 illustrates a top-down view of the structure 100 after an intermediate operation of a method of fabricating a semiconductor device according to one or more embodiments. A sacrificial gate 800 (illustrated in FIG. 8) having a hard mask 700 is formed on the sacrificial liner 600. The hard mask 700 is formed on a top surface of the sacrificial gate. The hard mask 700 can be any suitable material, such as, for example, a silicon nitride (SiN). Any known manner of forming the sacrificial gate 800 can be utilized. In some embodiments, the sacrificial gate 800 is formed by patterning the hard mask 700 and using a wet or dry etching operation to selectively remove portions of the sacrificial gate 800 material which are not covered by the pattered hard mask 700. In some embodiments, hard mask 700 is patterned by a sidewall image transfer (SIT) operation. In still other embodiments, hard mask 700 is patterned by a photomask operation. In some embodiments, the etching operating is a RIE etch selective to the sacrificial liner 600.

Figure 8:
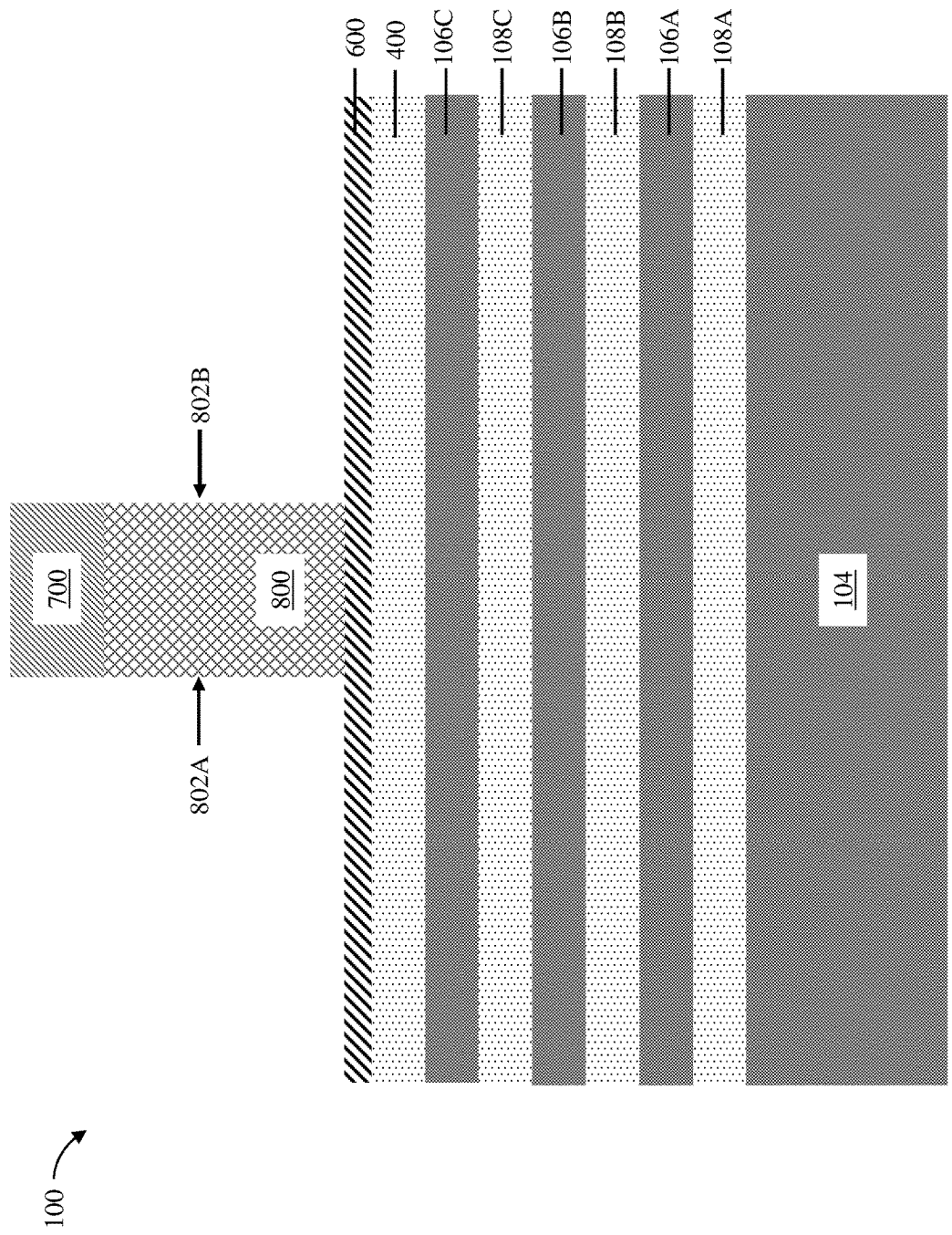
FIG. 8 depicts a cross-sectional view of the structure along the line Y-Y' of FIG. 7 after forming the sacrificial gate and the hard mask according to one or more embodiments of the present invention.

FIG. 8 illustrates a cross-sectional view of the structure 100 along the line Y-Y' of FIG. 7 after forming the sacrificial gate 800 and the hard mask 700. The sacrificial gate 700 includes a first gate sidewall 802A and a second gate sidewall 802B.

Figure 9:
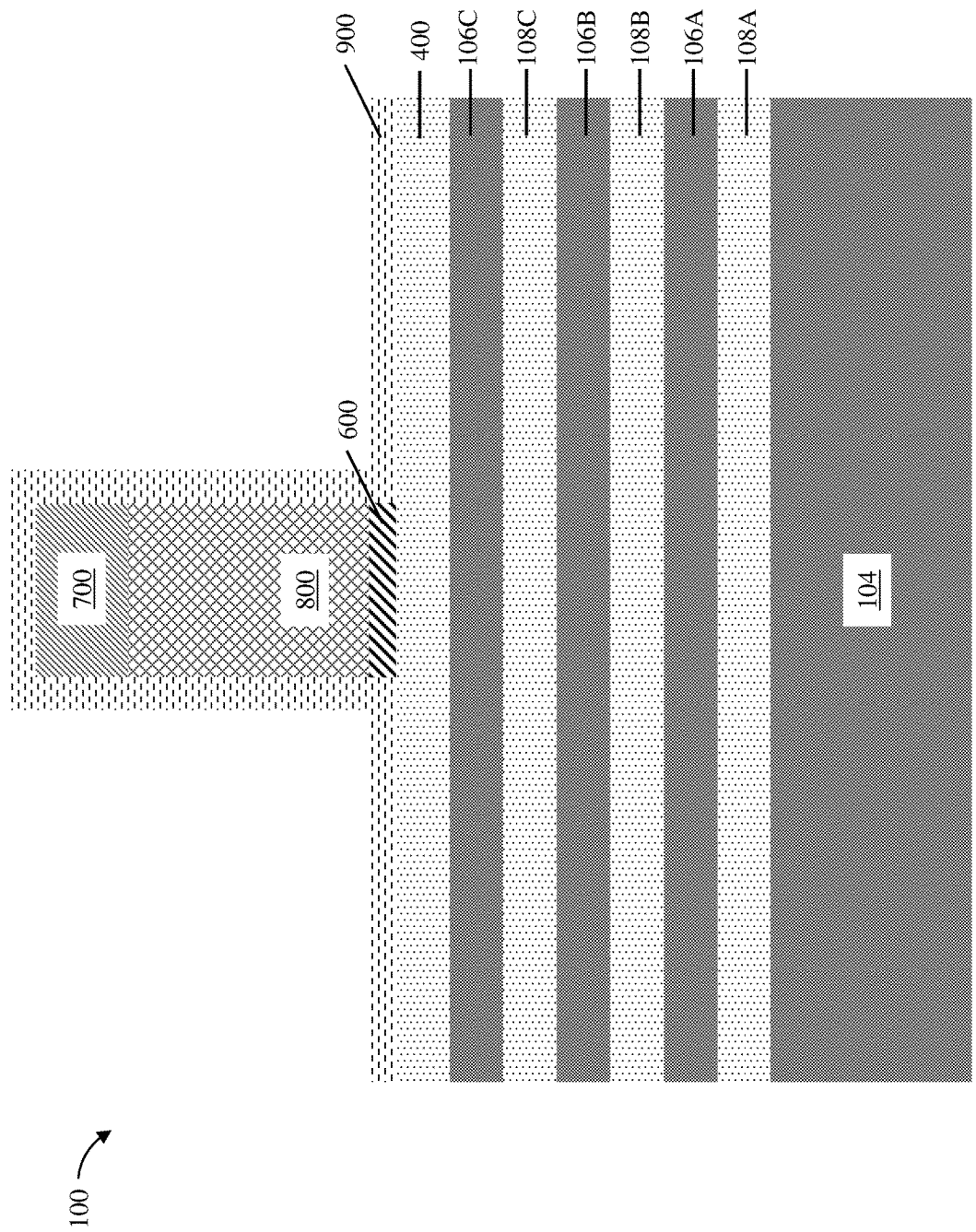
FIG. 9 depicts a cross-sectional view of the structure along the line Y-Y' of FIG. 7 after removing exposed portions of the sacrificial liner according to one or more embodiments of the present invention.

FIG. 9 illustrates a cross-sectional view of the structure 100 along the line Y-Y' of FIG. 7 after removing exposed portions of the sacrificial liner 600. The sacrificial liner 600 can be removed by, for example, a directional etch. An outer spacer layer 900 is formed on the sacrificial material cover 400, the hard mask 700, and the sacrificial gate 800. Any known manner of forming the outer spacer layer 900 can be utilized. In some embodiments, the outer spacer layer 900 is conformally deposited using chemical vapor deposition (CVD), plasma-enhanced chemical vapor deposition (PECVD), atomic layer deposition (ALD), physical vapor deposition (PVD), chemical solution deposition, or other like processes. The outer spacer layer 900 can be any suitable material, such as, for example, silicoboron carbonitride (SiBCN).

Figure 10:
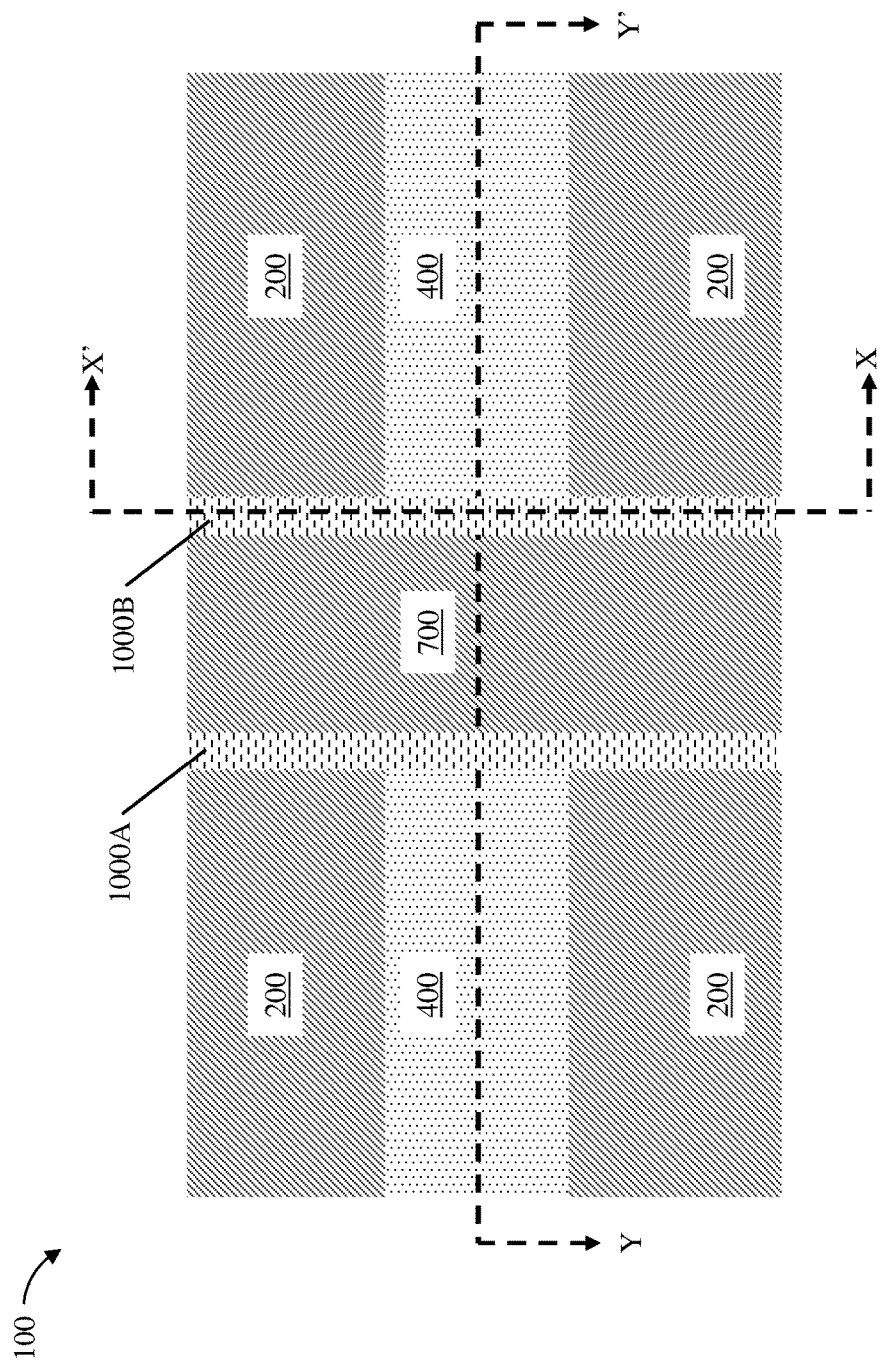
FIG. 10 depicts a top-down view of the structure after removing portions of the outer spacer layer to expose a top surface of the hard mask and a top surface of the sacrificial material cover, forming a first outer spacer and a second outer spacer according to one or more embodiments of the present invention.

FIG. 10 illustrates a top-down view of the structure 100 after removing portions of the outer spacer layer 900 to expose a top surface of the hard mask 700 and a top surface of the sacrificial material cover 400, forming a first outer spacer 1000A and a second outer spacer 1000B. Any known manner of removing portions of the outer spacer layer 900 can be utilized. In some embodiments, the portions are removed using a directional etch selective to the hard mask 700 and the sacrificial material cover 400. In some embodiments, the directional etch is a reactive ion etch.

Figure 11:
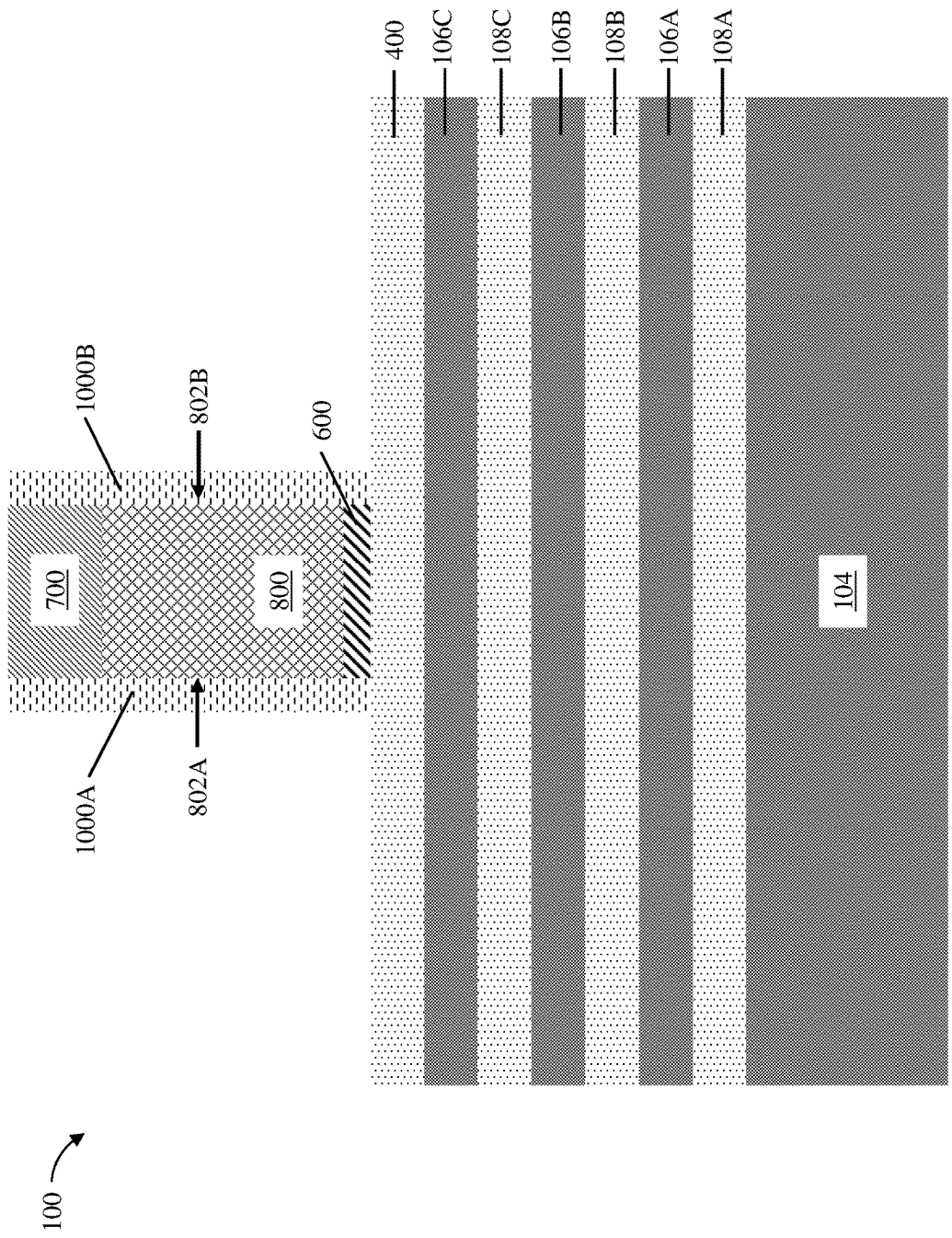
FIG. 11 depicts a cross-sectional view of the structure along the line Y-Y' of FIG. 10 after forming the first and second outer spacers on the first and second gate sidewalls according to one or more embodiments of the present invention.

FIG. 11 illustrates a cross-sectional view of the structure 100 along the line Y-Y' of FIG. 10 after forming the first outer spacer 1000A and the second outer spacer 1000B on the first gate sidewall 802A and the second gate sidewall 802B, respectfully. The first and second outer spacers 1000A and 1000B each cover a portion of the hard mask 700 and a portion of the sacrificial liner 600.

Figure 12:
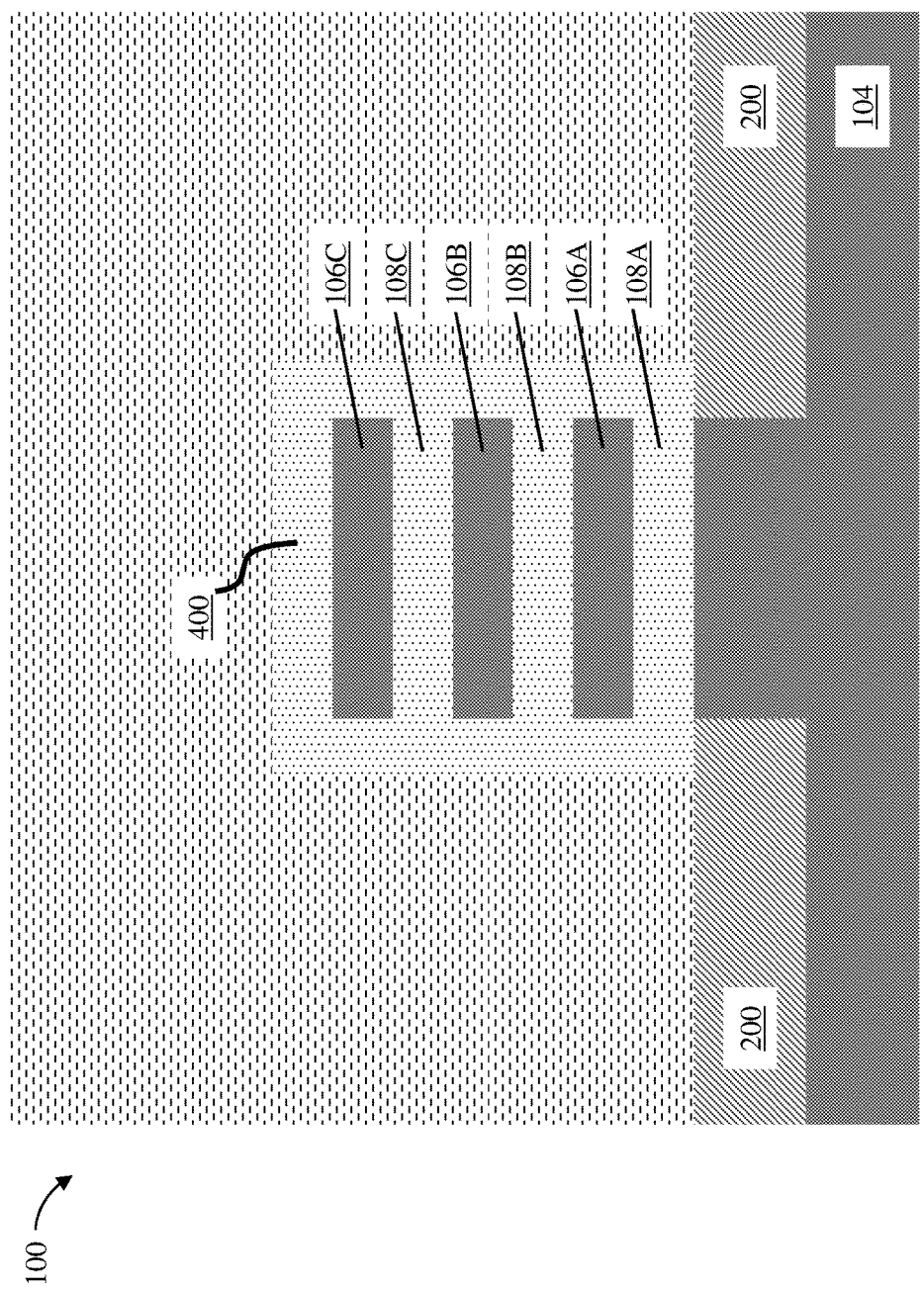
FIG. 12 depicts a cross-sectional view of the structure along the line X-X' of FIG. 10 after forming the first outer spacer and the second outer spacer on the first gate sidewall and the second gate sidewall, respectfully, according to one or more embodiments of the present invention.

FIG. 12 illustrates a cross-sectional view of the structure 100 along the line X-X' of FIG. 10 after forming the first outer spacer 1000A and the second outer spacer 1000B on the first gate sidewall 802A and the second gate sidewall 802B, respectfully.

Figure 13:
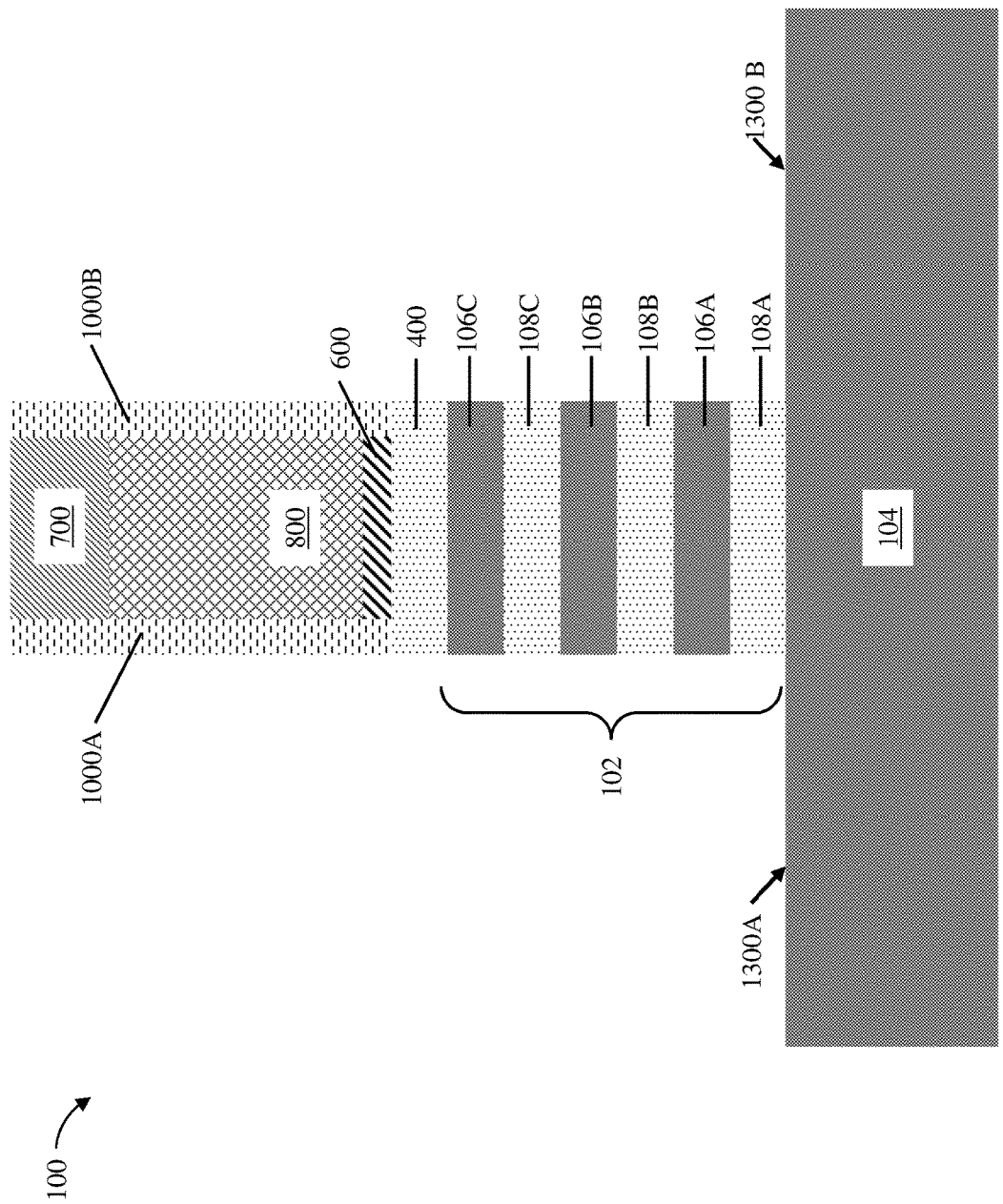
FIG. 13 depicts a cross-sectional view of the structure along the line Y-Y' of FIG. 10 after removing portions of the nanosheet stack to expose a first portion and a second portion of the substrate according to one or more embodiments of the present invention.

FIG. 13 illustrates a cross-sectional view of the structure 100 along the line Y-Y' of FIG. 10 after removing portions of the nanosheet stack 102 to expose a first portion 1300A and a second portion 1300B of the substrate 104. The first and second portions 1300A and 1300B are on opposite sides of the nanosheet stack 102. Any known manner of removing portions of the nanosheet stack 102 can be utilized. In some embodiments, the portions are removed using a RIE operation.

Figure 14:
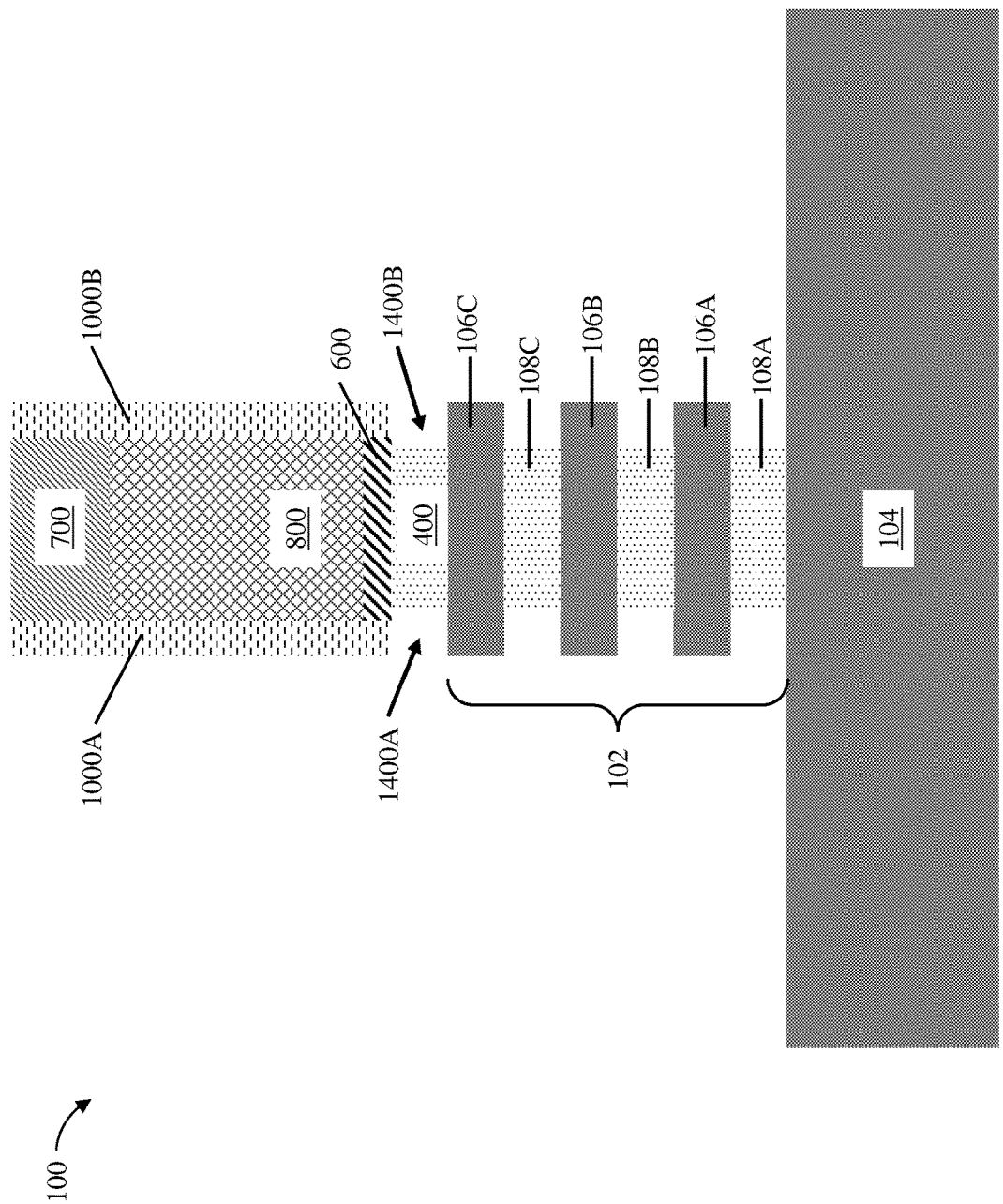
FIG. 14 depicts a cross-sectional view of the structure along the line Y-Y' of FIG. 10 after removing portions of the sacrificial material cover and portions of the three sacrificial layers to form recessed regions on opposite ends of the nanosheet stack according to one or more embodiments of the present invention.

FIG. 14 illustrates a cross-sectional view of the structure 100 along the line Y-Y' of FIG. 10 after removing portions of the sacrificial material cover 400 and portions of the three sacrificial layers 108A, 108B, and 108C to form recessed regions 1400A and 1400B (partially depicted here and in FIG. 15) on opposite ends of the nanosheet stack 102. Forming the recessed regions 1400A and 1400B exposes portions of the nanosheets 106A, 106B, and 106C. In some embodiments, the sacrificial material cover 400 and the three sacrificial layers 108A, 108B, and 108C are SiGe and a lateral etch is employed to selectively etch back the SiGe to form the recessed regions 1400A and 1400B. The lateral etch can be, for example, a RIE or wet etch. In some embodiments, the lateral etch removes equal portions from each of the sacrificial material cover 400 and the three sacrificial layers 108A, 108B, and 108C such that remaining portions of the sacrificial material cover 400 and the three sacrificial layers 108A, 108B, and 108C have a same width across the nanosheet stack 102.

Figure 15:
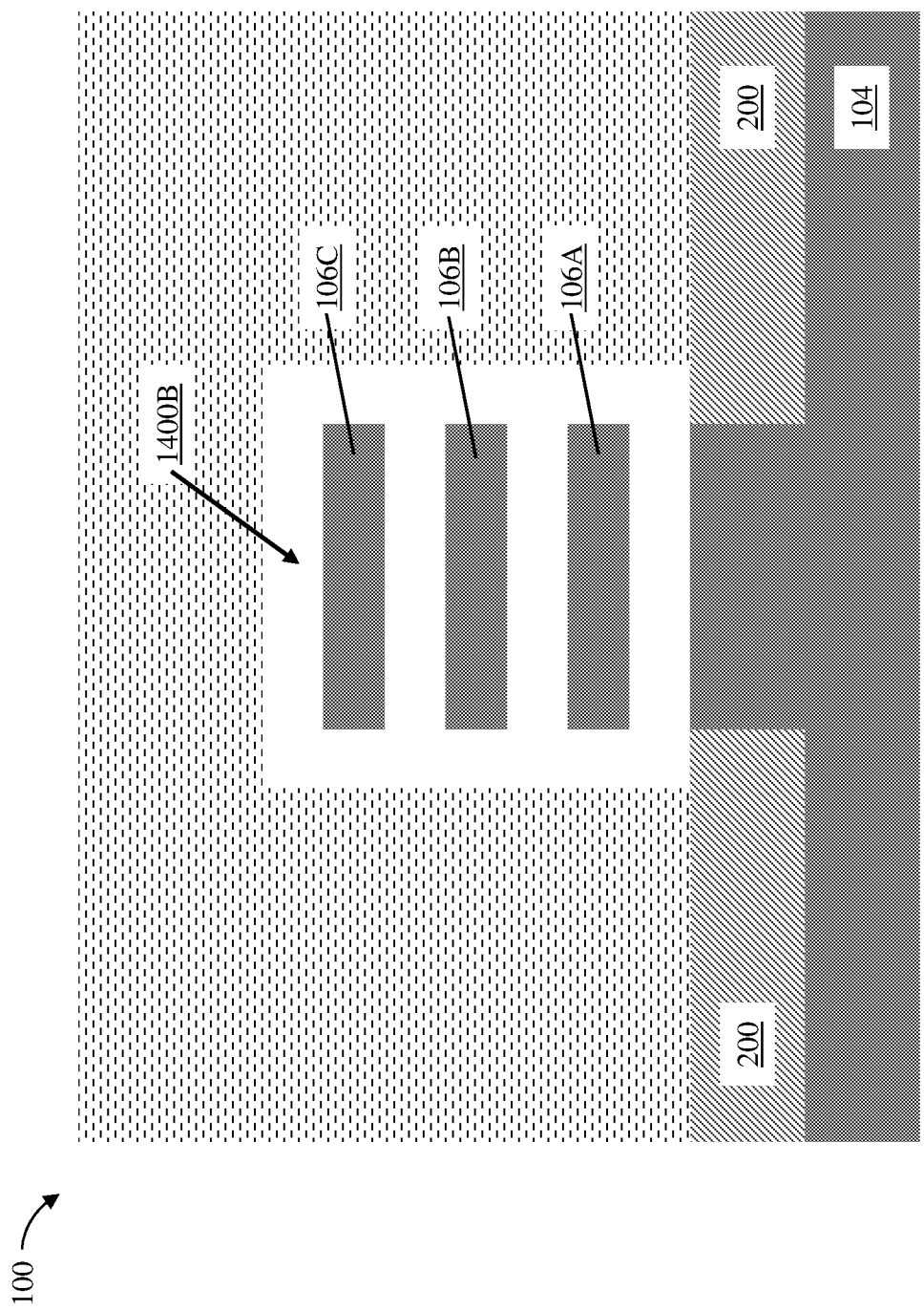
FIG. 15 depicts a cross-sectional view of the structure along the line X-X' of FIG. 10 after forming the recessed regions according to one or more embodiments of the present invention.

FIG. 15 illustrates a cross-sectional view of the structure 100 along the line X-X' of FIG. 10 after forming the recessed regions 1400A (depicted in FIG. 14) and 1400B. From this illustration it is readily apparent that the portions of the sacrificial material cover 400 which covered the sidewalls 404A and 404B of the nanosheet stack 102 (as depicted in FIG. 4) have been removed such that the recessed regions 1400A and 1400B each wrap around a respective end of the nanosheets 106A, 106B, and 106C.

Figure 16:
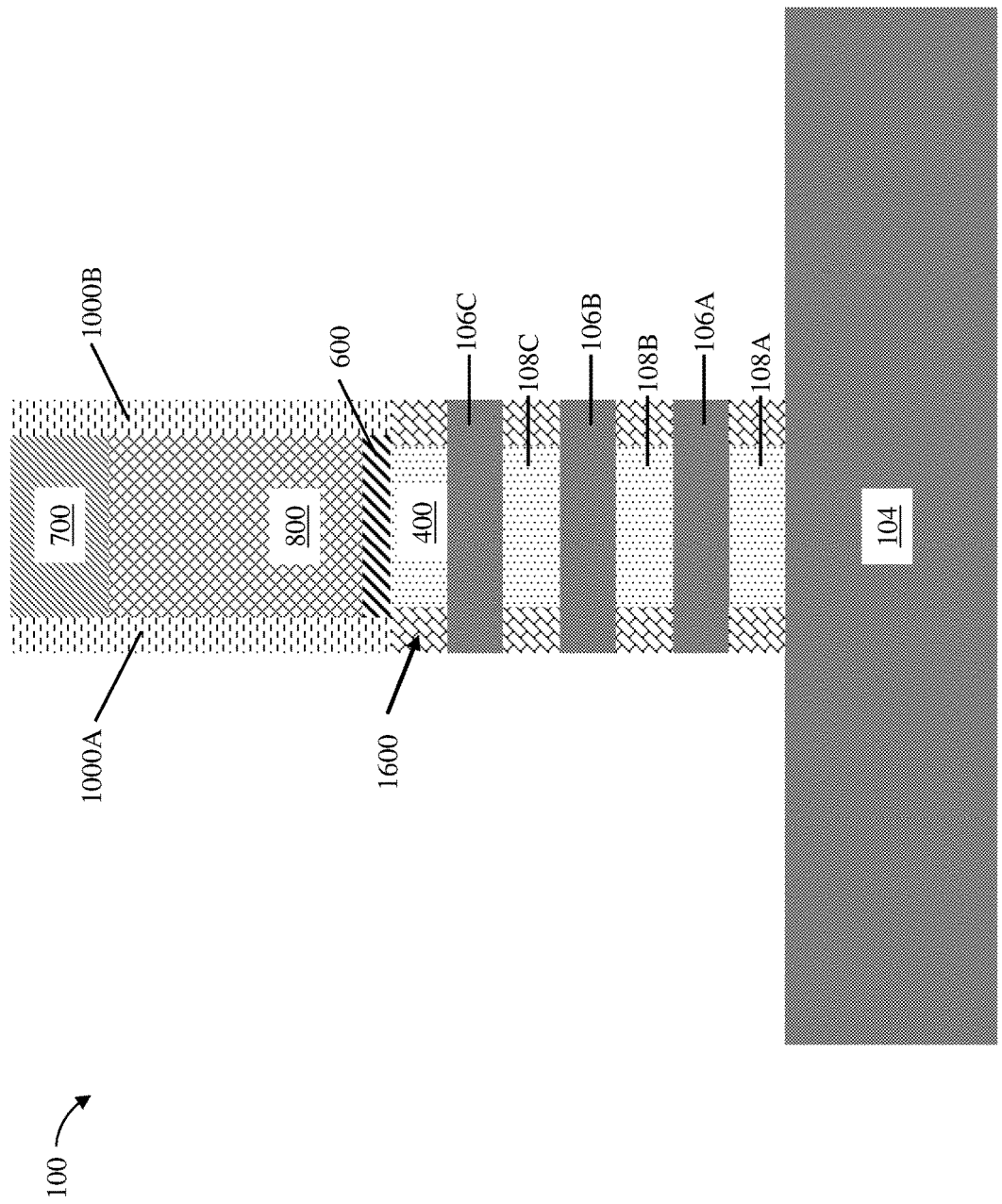
FIG. 16 depicts a cross-sectional view of the structure along the line Y-Y' of FIG. 10 after forming an inner spacer region in the recessed regions according to one or more embodiments of the present invention.

FIG. 16 illustrates a cross-sectional view of the structure 100 along the line Y-Y' of FIG. 10 after forming an inner spacer region 1600 in the recessed regions 1400A and 1400B. In some embodiments, the inner spacer region 1600 is a single structure that wraps around each of the nanosheets 106A, 106B, and 106C. The inner spacer region 1600 can be any suitable material, such as, for example, a silicon nitride (SiN), silicon dioxide ($SiO_2$), a silicon oxynitride (SiON), a silicon carbide (SiC), SiCON, and SiCO.

In some embodiments, the inner spacer region 1600 is a low-k dielectric material selective to silicoboron carbonitride (SiBCN), such as, for example, a silicon nitride (SiN). Any known composition and manner of forming the inner spacer region 1600 can be utilized. In some embodiments, the inner spacer region 1600 is formed on exposed surfaces of the nanosheets 106A, 106B, and 106C using a conformal deposition operation, such as CVD or ALD, such that the inner spacer region 1600 pinches off the recessed regions 1400A and 1400B, and then 1600 is etched to only keep the portion inside the recessed regions.

Figure 17:
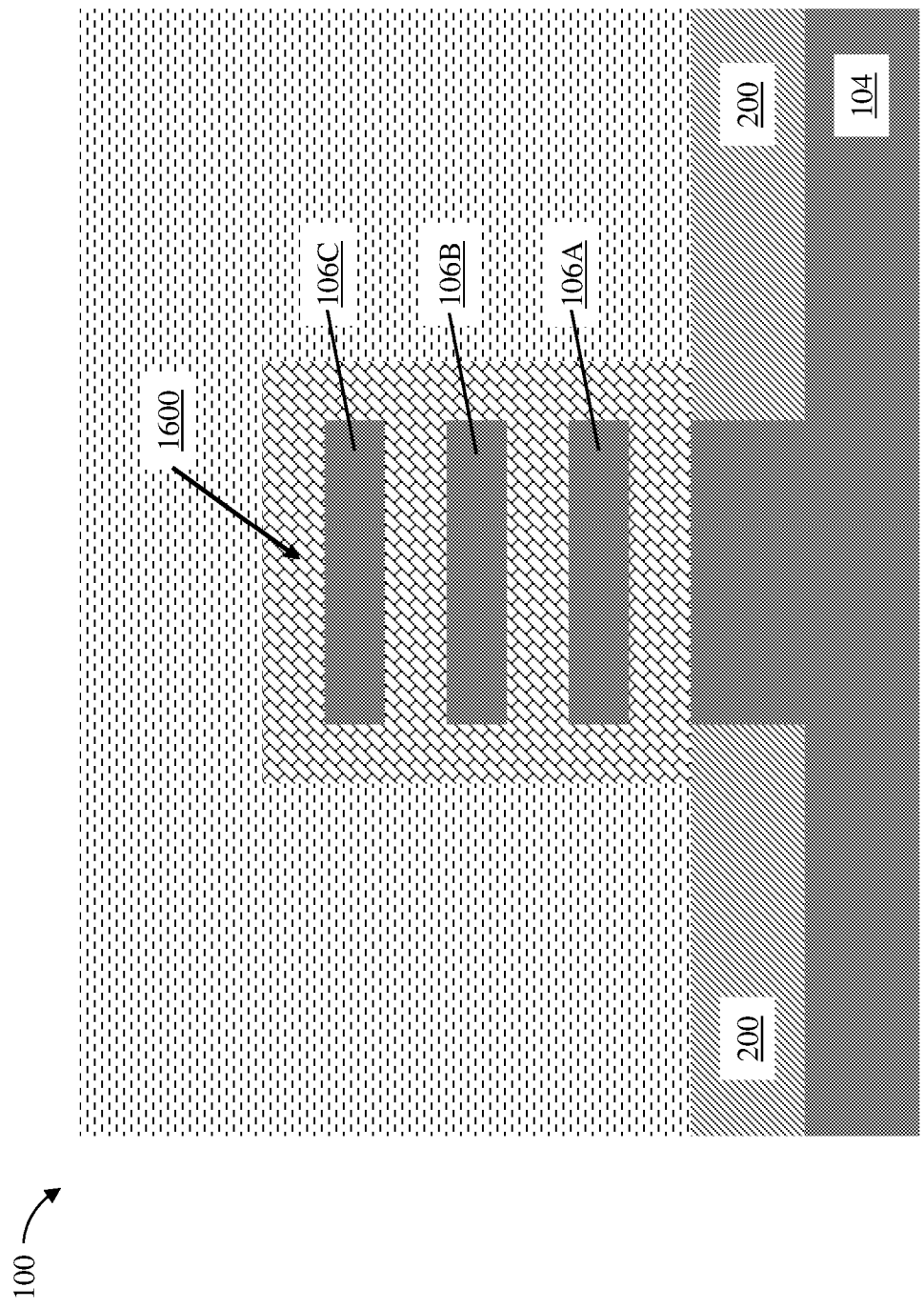
FIG. 17 depicts a cross-sectional view of the structure along the line X-X' of FIG. 10 after forming an inner spacer region in the recessed regions according to one or more embodiments of the present invention.

FIG. 17 illustrates a cross-sectional view of the structure 100 along the line X-X' of FIG. 10 after forming an inner spacer region 1600 in the recessed regions 1400A and 1400B. From this illustration it is readily apparent that the inner spacer region 1600 wraps around each nanosheet 106A, 106B, and 106C.

Figure 18:
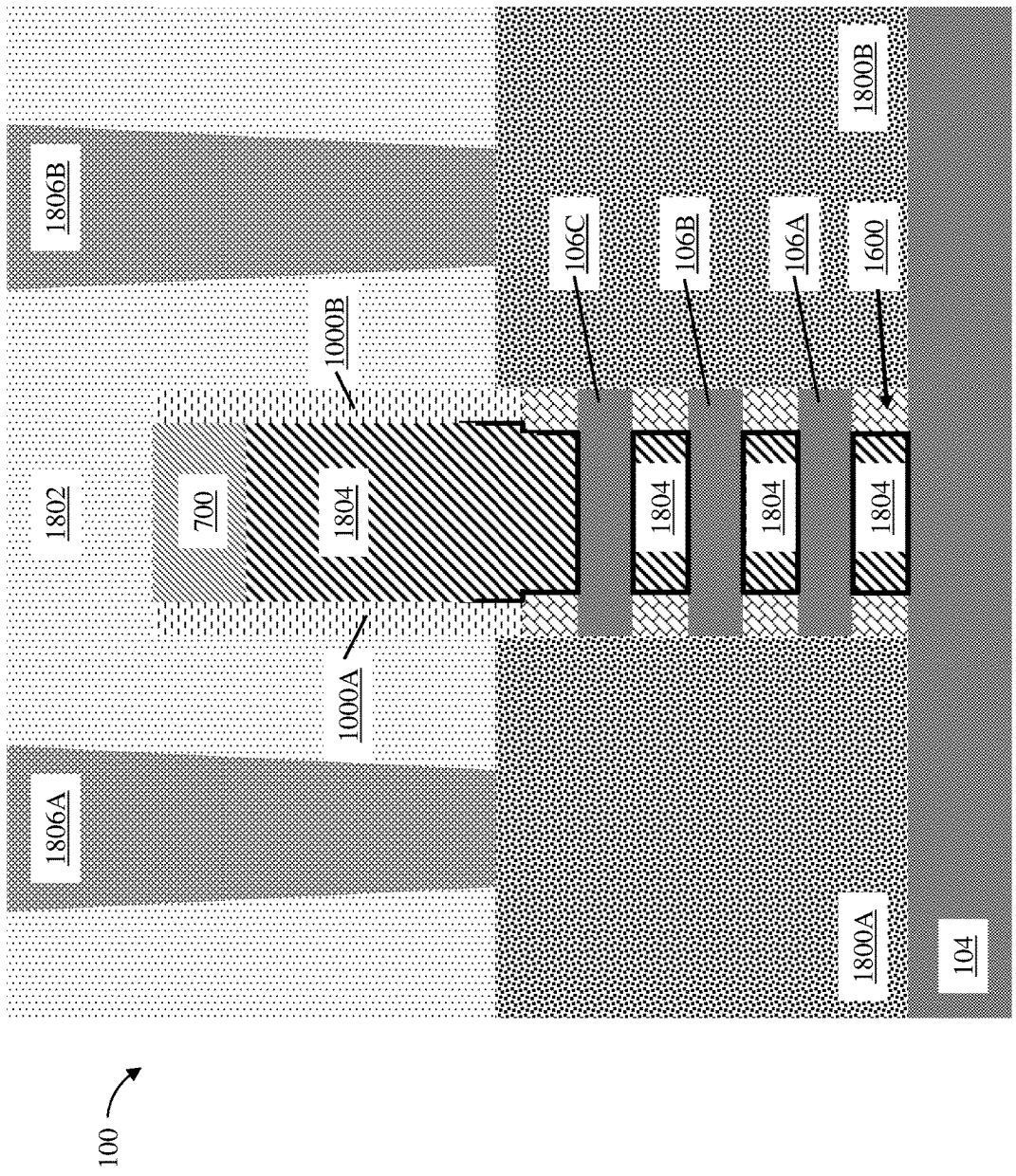
FIG. 18 depicts a cross-sectional view of the structure along the line Y-Y' of FIG. 10 after an intermediate operation of a method of fabricating a semiconductor device according to one or more embodiments of the present invention.

FIG. 18 illustrates a cross-sectional view of the structure 100 along the line Y-Y' of FIG. 10 after an intermediate operation of a method of fabricating a semiconductor device according to one or more embodiments. A first epitaxy region 1800A is formed on the first portion 1300A (depicted in FIG. 13) of the substrate 104 and a second epitaxy region 1800B is formed on the second portion 1300B (depicted in FIG. 13) of the substrate 104, such that each nanosheet 106A, 106B, and 106C includes a first end facing the first epitaxy region 1800A and a second end facing the second epitaxy region 1800B. The first and second epitaxy regions 1800A and 1800B can be source or drain regions formed in the substrate 104 by a variety of methods, such as, for example, in-situ doping during epitaxial growth and/or diffusion and/or ion implantation. The first and second epitaxy regions 1800A and 1800B are complementary, such that one of the epitaxy regions 1800A and 1800B is a source while the other is a drain.

In some embodiments, an interlayer dielectric (ILD) 1802 is formed over the first epitaxy region 1800A, the second epitaxy region 1800B, the first and second outer spacer layers 1000A and 1000B, the hard mask 700, and the dielectric isolation layer 200 (depicted in FIG. 17). Any known manner of forming the ILD 1802 can be utilized. The ILD 1802 can be any suitable material, such as, for example, porous silicates, carbon doped oxides, silicon dioxides, silicon nitrides, silicon oxynitrides, or other dielectric materials. The ILD 1802 can be formed using, for example, chemical vapor deposition (CVD), plasma enhanced chemical vapor deposition, atomic layer deposition, flowable CVD, spin-on dielectrics, or physical vapor deposition.

In some embodiments, the sacrificial gate 800 and the remaining portions of the sacrificial layers 108A, 108B, and 108C are replaced with a metal gate 1804. In still other embodiments, a metallization operation deposits a first contact 1806A contacting the first epitaxy region 1800A and a second contact 1806B contacting the second epitaxy region 1800B. Any known manner of depositing the first and second contacts 1806A and 1806B can be utilized. In some embodiments, the ILD 1802 is patterned with open trenches and the first and second contacts 1806A and 1806B are deposited into the trenches.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A method for forming a semiconductor device, the method comprising:

forming a nanosheet stack disposed above a substrate, the nanosheet stack having a first vertically-stacked nanosheet on a first sacrificial layer, the first vertically-stacked nanosheet and the first sacrificial layer each having a first end facing a first epitaxy region and a second end facing a second epitaxy region;

forming a top sacrificial layer on a top surface of a topmost nanosheet of the nanosheet stack, said top sacrificial layer having a first end facing a first epitaxy region and a second end facing a second epitaxy region;

forming a sidewall sacrificial layer on two opposite sidewalls of the nanosheet stack, such that the first and second ends of the first vertically-stacked nanosheet are exposed;

removing the sidewall sacrificial layer, a portion of the first and second ends of the first sacrificial layer, and a portion of the first and second ends of the top sacrificial layer to expose portions of the first vertically-stacked nanosheet; and forming an inner spacer region on the first vertically-stacked nanosheet to replace the removed sidewall sacrificial layer, the removed portions of the first sacrificial layer, and the removed portions of the top sacrificial layer.

2. The method of claim 1, further comprising:

removing portions of the nanosheet stack to expose a first surface and a second surface of the substrate, said first and second surfaces on opposite sides of the nanosheet stack;

forming a dielectric isolation layer on the first and second surfaces of the substrate;

forming a sacrificial liner on the top sacrificial layer and the dielectric isolation layer;

forming a sacrificial gate having a first and second gate sidewall on the sacrificial liner, a top surface of the sacrificial gate covered by a hard mask;

forming a first outer spacer on the first gate sidewall, a first surface of the hard mask, and a first surface of the sacrificial liner;

forming a second outer spacer on the second gate sidewall, a second surface of the hard mask, and a second surface of the sacrificial liner; and removing portions of the first and second outer spacers and portions of the sacrificial liner to expose a top surface of the top sacrificial layer and a top surface of the hard mask.

3. The method of claim 2, further comprising:

removing portions of the nanosheet stack to expose a first portion and a second portion of the substrate, said first and second portions on opposite sides of the nanosheet stack;

forming the first epitaxy region on the first portion of the substrate and forming the second epitaxy region on the second portion of the substrate;

forming an interlayer dielectric (ILD) on the first epitaxy region, the second epitaxy region, the first and second outer spacer layers, the hard mask, and the dielectric isolation layer;

replacing the sacrificial gate and the remaining portions of the first sacrificial layer with a metal;

depositing a first contact in the ILD to contact the first epitaxy region; and depositing a second contact in the ILD to contact the second epitaxy region.

4. The method of claim 1, wherein forming the nanosheet stack further comprises forming a plurality of vertically-stacked nanosheets and a plurality of sacrificial layers, each nanosheet separated by a sacrificial layer, each nanosheet and sacrificial layer having a first end facing a first epitaxy region and a second end facing a second epitaxy region.

5. The method of claim 4, wherein each of the plurality of sacrificial layers has a thickness of about 4 nm to about 10 nm.

6. The method of claim 4, wherein each of the plurality of sacrificial layers has a thickness of about 6 nm.

7. The method of claim 1, wherein a remaining portion of the first sacrificial layer after removing a portion of the first and second ends of the first sacrificial layer has a first thickness, and a remaining portion of the top sacrificial layer after removing a portion of the first and second ends of the top sacrificial layer has a second thickness, and wherein the first thickness is equal to the second thickness.

8. The method of claim 1, wherein the inner spacer region is selected from the group consisting of a silicon nitride (SiN), silicon dioxide ($SiO_2$), a silicon oxynitride (SiON), and a silicon carbide (SiC).

9. The method of claim 1, wherein the inner spacer region is a low-k dielectric material selective to silicoboron carbonitride (SiBCN).

10. A method for forming a semiconductor device, the method comprising:

forming a nanosheet stack disposed above a substrate, the nanosheet stack having a plurality of vertically-stacked nanosheets alternating with a plurality of sacrificial layers, such that each nanosheet is separated by a sacrificial layer and such that the substrate is separated from the nanosheet stack by a sacrificial layer, each nanosheet and sacrificial layer having a first end facing a first epitaxy region and a second end facing a second epitaxy region;

forming a sacrificial material cover over a top surface and two opposite sidewalls of the nanosheet stack, said sacrificial material cover exposing the first and second ends of the first vertically-stacked nanosheet;

forming a gate structure on the nanosheet stack, said gate structure including a sacrificial gate having two gate sidewalls and an outer spacer formed on each of the two gate sidewalls;

removing a portion of the sacrificial material cover and a portion of the first sacrificial layer from the first and second ends of the first sacrificial layer to expose portions of the first vertically-stacked nano sheet; and forming an inner spacer region on the first vertically-stacked nanosheet to replace the removed sacrificial material cover and the removed portions of the first sacrificial layer.

11. The method of claim 10, wherein forming the gate structure further comprises:

removing portions of the nanosheet stack to expose a first surface and a second surface of the substrate, said first and second surfaces on opposite sides of the nanosheet stack;

forming a dielectric isolation layer on the first and second surfaces of the substrate;

forming a sacrificial liner on the sacrificial material cover and the dielectric isolation layer;

forming the sacrificial gate on the sacrificial liner, a top surface of the sacrificial gate covered by a hard mask; and removing portions of the first and second outer spacers and portions of the sacrificial liner to expose a top surface of the top sacrificial layer and a top surface of the hard mask.

12. The method of claim 11, further comprising:
- removing portions of the nanosheet stack to expose a first portion and a second portion of the substrate, said first and second portions on opposite sides of the nanosheet stack;
- forming the first epitaxy region on the first portion of the substrate and forming the second epitaxy region on the second portion of the substrate;
- forming an interlayer dielectric (ILD) on the first epitaxy region, the second epitaxy region, the first and second outer spacer layers, the hard mask, and the dielectric isolation layer;
- replacing the sacrificial gate and the remaining portions of the first sacrificial layer with a metal;
- depositing a first contact in the ILD contacting a surface of the first epitaxy region; and
- depositing a second contact in the ILD contacting a surface of the second epitaxy region.

13. The method of claim 10, wherein the inner spacer region is selected from the group consisting of a silicon nitride (SiN), silicon dioxide ($SiO_2$), a silicon oxynitride (SiON), a silicon carbide (SiC), SiCON, and SiCO.

14. The method of claim 10, wherein the plurality of sacrificial layers and the sacrificial material cover each have a thickness of about 4 nm to about 10 nm.

15. The method of claim 10, wherein the plurality of sacrificial layers and the sacrificial material cover each have a thickness of about 6 nm.

16. A semiconductor device, the device comprising:
- a nanosheet stack disposed above a substrate, the nanosheet stack having a first nanosheet on a first sacrificial layer, the first nanosheet and the first sacrificial layer each having a first end facing a first epitaxy region and a second end facing a second epitaxy region, said first and second ends of the first sacrificial layer recessed from the first and second ends of the first nanosheet;
- a top sacrificial layer on a top surface of a topmost nanosheet of the nanosheet stack, the top sacrificial layer having a first end facing a first epitaxy region and a second end facing a second epitaxy region, said first and second ends of the top sacrificial layer recessed from the first and second ends of the first nanosheet; and
- an inner spacer region wrapping around a top surface, a bottom surface, and two sidewall surfaces of the first nanosheet, such that the first and second ends of the first nanosheet are exposed.

17. The semiconductor device of claim 16, further comprising:
- a dielectric isolation layer on a first and second surface of the substrate;
- a gate structure on the nanosheet stack, said gate structure including a gate having a first and a second gate sidewall;
- a sacrificial liner between the top sacrificial layer and the gate;
- a hard mask on a top surface of the gate;
- a first outer spacer formed on the first gate sidewall, a first surface of the hard mask, and a first surface of the sacrificial liner; and
- a second outer spacer formed on the second gate sidewall, a second surface of the hard mask, and a second surface of the sacrificial liner.

18. The semiconductor device of claim 17, further comprising:
- a first epitaxy region on a first portion of the substrate;
- a second epitaxy region on a second portion of the substrate;
- an interlayer dielectric (ILD) on the first epitaxy region, the second epitaxy region, the first and second outer spacer layers, the hard mask, and the dielectric isolation layer;
- a first contact deposited in the ILD that contacts a surface of the first epitaxy region; and
- a second contact deposited in the ILD that contacts a surface of the second epitaxy region.

19. The semiconductor device of claim 16, wherein the nanosheet stack further comprises a plurality of vertically-stacked nanosheets alternating with a plurality of sacrificial layers disposed above the first nanosheet, such that each nanosheet is separated by a sacrificial layer and such that the substrate is separated from the nanosheet stack by a sacrificial layer, each nanosheet and sacrificial layer having a first end facing a first epitaxy region and a second end facing a second epitaxy region.

20. The semiconductor device of claim 19, wherein each of the plurality of sacrificial layers has a thickness of about 6 nm.

* * * * *